United States Patent
Matsuyama et al.

(10) Patent No.: US 11,200,480 B2
(45) Date of Patent: Dec. 14, 2021

(54) COUNTER READOUT CIRCUIT

(71) Applicant: Murata Manufacturing Co., Ltd., Kyoto (JP)

(72) Inventors: Satoru Matsuyama, Kyoto (JP); Satoshi Matsumura, Kyoto (JP); Kazuhiro Nakamuta, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 101 days.

(21) Appl. No.: 16/690,772

(22) Filed: Nov. 21, 2019

(65) Prior Publication Data

US 2020/0167629 A1    May 28, 2020

(30) Foreign Application Priority Data

Nov. 26, 2018    (JP) ............... JP2018-220483

(51) Int. Cl.
*G06M 1/27*    (2006.01)
(52) U.S. Cl.
CPC .................... *G06M 1/27* (2013.01)
(58) Field of Classification Search
CPC . G06M 1/27; G06F 1/14; H03K 21/14; G11C 7/1069; G11C 7/222; G11C 7/1066; G11C 8/04; H03D 13/001

USPC ................ 235/132 R, 61 FB, 99 A; 702/187
See application file for complete search history.

(56) References Cited

U.S. PATENT DOCUMENTS

| | | | |
|---|---|---|---|
| 7,397,725 B2* | 7/2008 | Stark .................... | G06F 13/4217 365/194 |
| 8,688,404 B1* | 4/2014 | Levy ......................... | G06F 1/14 702/187 |
| 9,747,231 B2* | 8/2017 | Takeuchi ............. | G06F 13/4068 |
| 10,638,074 B1* | 4/2020 | Shin ........................ | G11C 7/222 |

FOREIGN PATENT DOCUMENTS

| JP | H07-98618 A | 4/1995 |
|---|---|---|
| JP | 2014157554 A * | 8/2014 |

* cited by examiner

*Primary Examiner* — Seung H Lee
(74) *Attorney, Agent, or Firm* — Pearne & Gordon LLP (57) ABSTRACT

A counter readout circuit includes a plurality of counter registers and an output data computing unit. The plurality of counter registers, each includes a counter which counts per clock signal cycle. The output data computing unit includes a computing unit which adds, for output, the counter value of a counter register to the total clock count from a first timing to a second timing. The counter register is selected from the plurality of counter registers. The first timing is common to all of the plurality of counter registers. The second timing is a timing of selection of the selected counter register.

5 Claims, 8 Drawing Sheets

COUNTER READOUT CIRCUIT

This application claims priority from Japanese Patent Application No. 2018-220483 filed on Nov. 26, 2018. The content of this application is incorporated herein by reference in its entirety.

BACKGROUND

The present disclosure relates to a counter readout circuit.

Japanese Unexamined Patent Application Publication No. 7-98618 describes a counter readout circuit which reads out the counter values of multiple counters.

When the counter values of multiple counters are to be read out sequentially, the counter values are read out from the counters at different readout timings in the readout sequence. In contrast, there is a demand that the counter values, at a common timing, of all of the counters are to be read out sequentially.

BRIEF SUMMARY

The present disclosure reads out the counter values, at a single timing, of multiple counters sequentially.

According to an aspect of the present disclosure, a counter readout circuit includes a plurality of counter registers and an output data computing unit. The plurality of counter registers, each includes a counter which counts per clock cycle. The output data computing unit includes a computing unit which adds, for output, the counter value of a counter register to the total clock count from a first timing to a second timing. The counter register is selected from the plurality of counter registers. The first timing is common to all of the plurality of counter registers. The second timing is a timing of selection of the selected counter register.

The present disclosure enables the counter values, at a single timing, of multiple counters to be read out sequentially.

Other features, elements, characteristics and advantages of the present disclosure will become more apparent from the following detailed description of embodiments of the present disclosure with reference to the attached drawings.

DESCRIPTION OF THE EMBODIMENTS

An embodiment of a counter readout circuit provided by the present disclosure will be described in detail below on the basis of the drawings. The embodiment does not necessarily limit the present disclosure. Needless to say, embodiments are exemplary, and partial replacement or combination with the configuration according to a different embodiment may be made. In a second embodiment and its subsequent embodiments, points common to a first embodiment will not be described, and only differences will be described. In particular, substantially the same effects produced by substantially the same configurations will not be described in each of the subsequent embodiments.

Embodiment

An embodiment will be described below. For ease of understanding of the embodiment, comparison examples will be described first.

First Comparison Example

Figure 1:
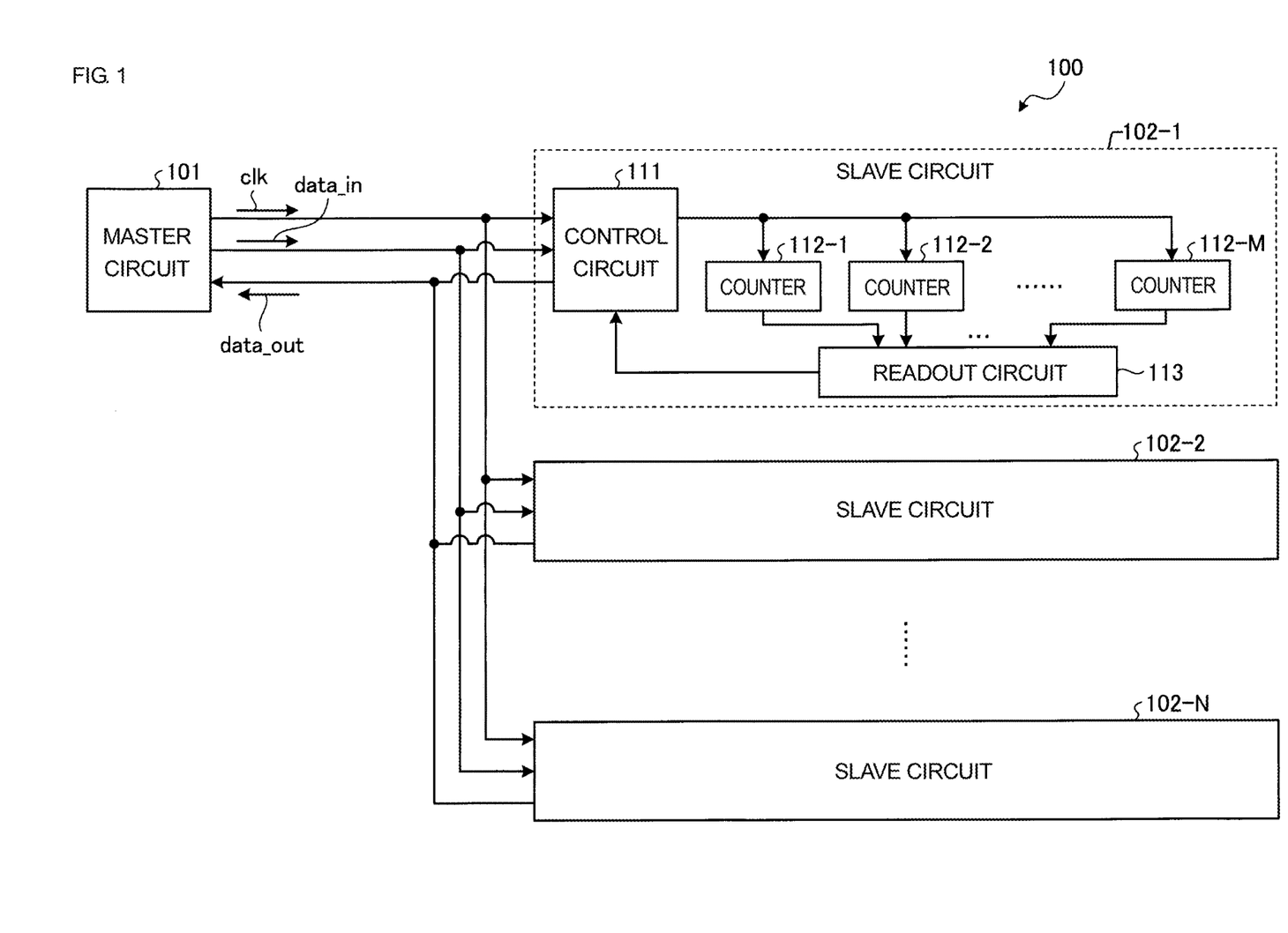
FIG. 1 is a diagram illustrating the system configuration according to a first comparison example.

FIG. 1 is a diagram illustrating the system configuration according to a first comparison example. A system 100 includes a master circuit 101 and multiple slave circuits 102-1 to 102-N (whose number is N that is a natural number, in the present disclosure).

The slave circuit 102-1 includes a control circuit 111, multiple counters 112-1 to 112-M (whose number is M that is a natural number, in the present disclosure), and a readout circuit 113.

In the present disclosure, a counter is assumed to be a down counter which decrements its counter value. However, this is not limiting. The counter may be assumed to be an up counter which increments its counter value. In addition, the counter is assumed to be an 8-bit counter. However, this is not limiting.

The configuration of each of the slave circuits 102-2 to 102-N is similar to that of the slave circuit 102-1, and will not be described.

The master circuit 101 outputs a clock signal clk and an input data signal data_in, which is serial data, to the slave circuits 102-1 to 102-N. The input data signal data_in includes a command.

Each of the slave circuits 102-1 to 102-N outputs an output data signal data_out, which is serial data, to the master circuit 101. The output data signal data_out includes the counter value of the corresponding one of the counters 112-1 to 112-M.

Operations of the system 100 will be described.

The master circuit 101 outputs a command (the input data signal data_in) for setting the initial values to the counters 112-1 to 112-M, to the control circuit 111. The control circuit 111 sets the initial values to the counters 112-1 to 112-M on the basis of the command.

The control circuit 111 outputs the clock signal clk, which is transmitted from the master circuit 101, to the counters 112-1 to 112-M. The counters 112-1 to 112-M decrement their counter values per clock cycle.

The master circuit 101 outputs, to the control circuit 111, a command (the input data signal data_in) for requesting readout of the counter values of the counters 112-1 to 112-M. The control circuit 111 requests the readout circuit 113 to read out the counter values on the basis of the command. The readout circuit 113 reads out the counter value of each of the counters 112-1 to 112-M sequentially, and outputs the counter value to the control circuit 111. The control circuit 111 outputs, to the master circuit 101, the output data signal data_out obtained by converting the counter value, which is parallel data, to serial data.

Figure 2:
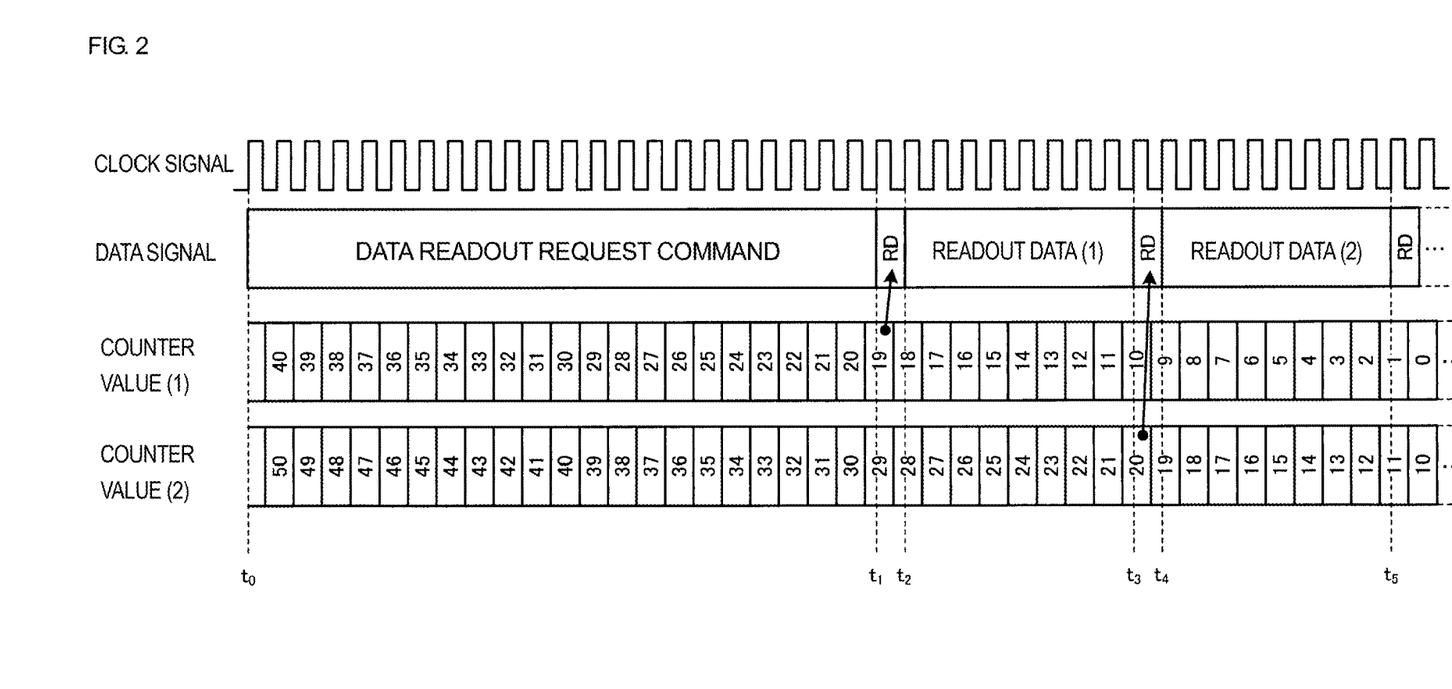
FIG. 2 is a timing chart of operations according to the first comparison example.

FIG. 2 is a timing chart of operations according to the first comparison example. Specifically, FIG. 2 is a timing chart of operations performed when the master circuit 101 requests readout of the counter values of the counters 112-1 to 112-M. FIG. 2 illustrates the counter values of the counters 112-1 and 112-2.

Over the entire range in FIG. 2, the clock signal clk is input to the slave circuit 102-1. Accordingly, over the entire range in FIG. 2, the counters 112-1 to 112-M decrement their counter values per clock cycle. The counter values are changed at every falling edge of the clock signal clk.

The counter 112-1 starts counting down from a counter value of "40". The counter 112-2 starts counting down from a counter value of "50".

From the timing $t_0$ to the timing $t_1$, the master circuit 101 outputs a data readout request command (the input data signal data_in) to the control circuit 111.

The one-clock period from the timing $t_1$ to the timing $t_2$ serves as the first data readout timing RD.

At the first data readout timing RD, the readout circuit 113 reads out the counter value, "19", of the counter 112-1, and outputs the counter value to the control circuit 111.

In the eight-clock period from the timing $t_2$ to the timing $t_3$, the control circuit 111 outputs, to the master circuit 101, the output data signal data_out obtained by converting the counter value of "19", which is parallel data, to 8-bit serial data.

The one-clock period from the timing $t_3$ to the timing $t_4$ serves as the second data readout timing RD.

At the second data readout timing RD, the readout circuit 113 reads out the counter value, "20", of the counter 112-2, and outputs the counter value to the control circuit 111.

In the eight-clock period from the timing $t_4$ to the timing $t_5$, the control circuit 111 outputs, to the master circuit 101, the output data signal data_out obtained by converting the counter value of "20", which is parallel data, to 8-bit serial data.

The control circuit 111 and the readout circuit 113 repeatedly perform operations similar to those from the timing $t_1$ to the timing $t_3$ (from the timing $t_3$ to the timing $t_5$) multiple times whose number is equal to the number of counters.

In the first comparison example, while the counter value of the counter 112-1 is read out at the timing $t_1$, the counter value of the counter 112-2 is successively read out at the timing $t_3$. Thus, the readout timings are different. In contrast, there is a demand that the counter values of all of the counters 112-1 to 112-M at a common timing (the timing $t_1$) are to be read out. That is, there is a demand that the counter value, "29", of the counter 112-2 at the timing $t_1$ is to be read out. The first comparison example fails to satisfy such a demand.

Second Comparison Example

Figure 3:
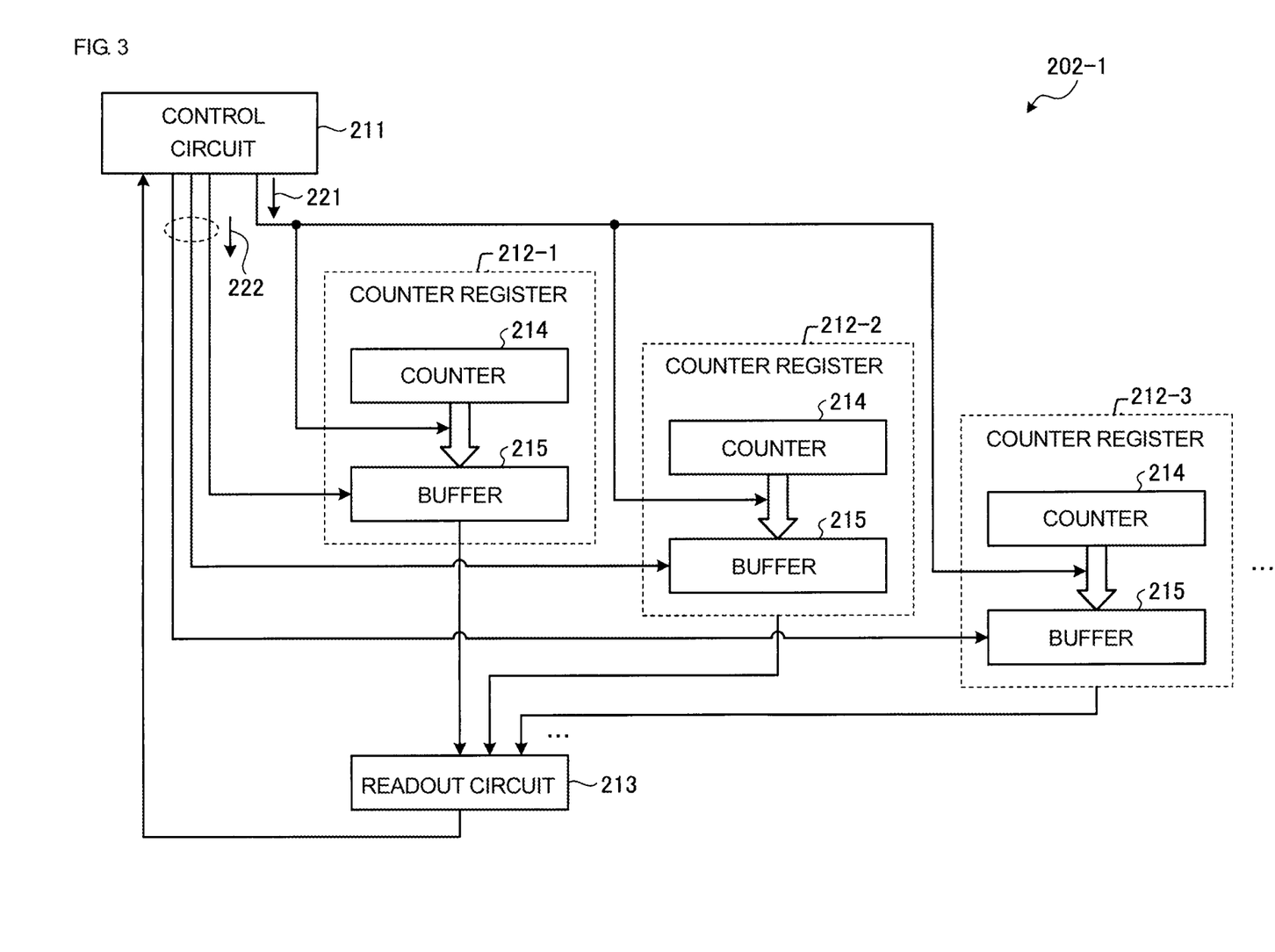
FIG. 3 is a diagram illustrating the configuration of a slave circuit according to a second comparison example.

FIG. 3 is a diagram illustrating the configuration of a slave circuit according to a second comparison example. The system configuration using a slave circuit 202-1 is similar to that according to the first comparison example in FIG. 1, and its illustration and description will not be made.

The slave circuit 202-1 includes a control circuit 211, multiple counter registers 212-1, 212-2, 212-3, etc., and a readout circuit 213. Each of the counter registers 212-1, 212-2, 212-3, etc. includes a counter 214 and a buffer 215.

Figure 4:
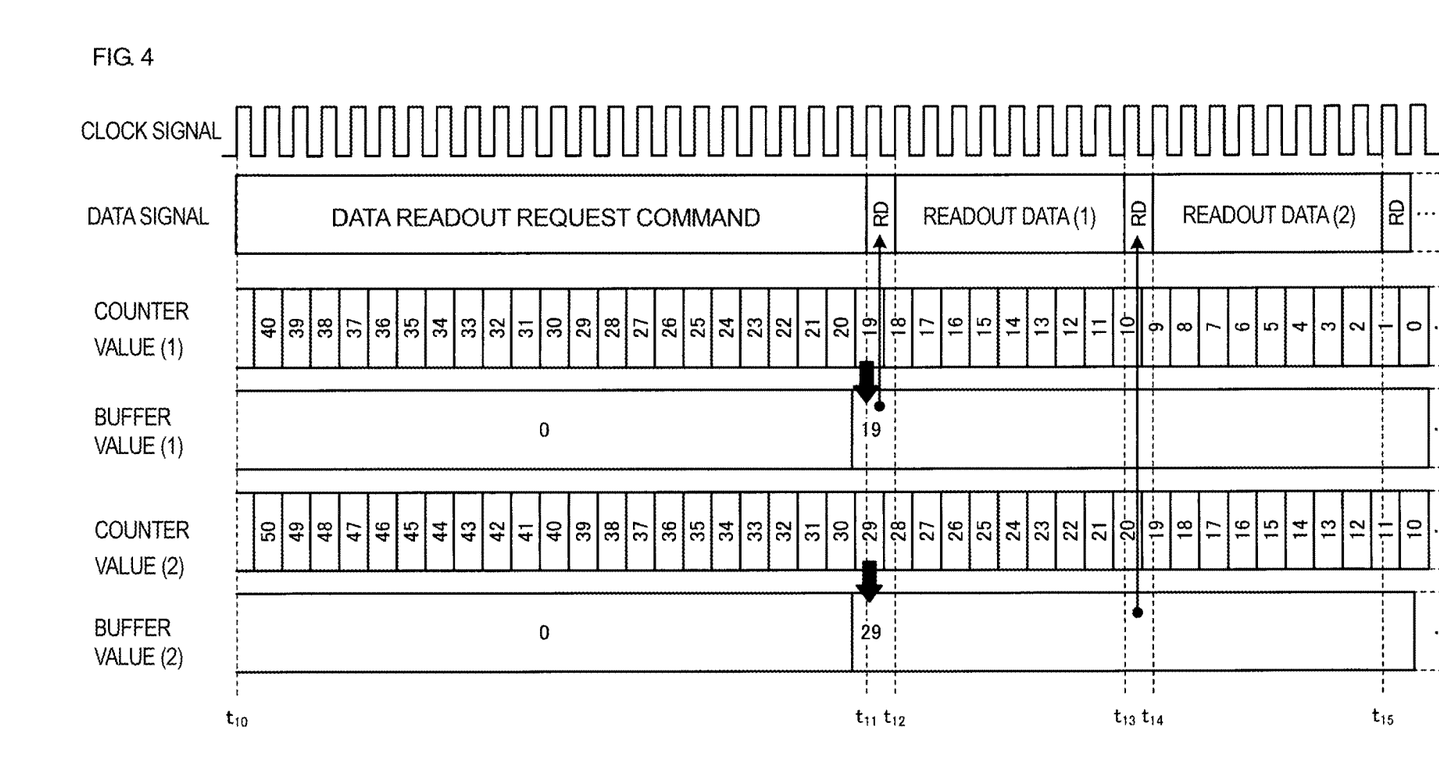
FIG. 4 is a timing chart of operations according to the second comparison example.

FIG. 4 is a timing chart of operations according to the second comparison example. Specifically, FIG. 4 is a timing chart of operations performed when the master circuit 101 requests readout of the counter values of the counters 214 in the counter registers 212-1, 212-2, 212-3, etc. FIG. 4 illustrates the counter values of the counters 214 in the counter registers 212-1 and 212-2.

Over the entire range in FIG. 4, a clock signal clk is input to the slave circuit 202-1. Accordingly, over the entire range in FIG. 4, the counters 214 in the counter registers 212-1, 212-2, 212-3, etc. decrement their counter values per clock cycle. The counter values are changed at every falling edge of the clock signal clk.

The counter 214 in the counter register 212-1 starts counting down from a counter value of "40". The counter 214 in the counter register 212-2 starts counting down from a counter value of "50".

From the timing $t_{10}$ to the timing $t_{11}$, the master circuit 101 outputs a data readout request command (the input data signal data_in) to the control circuit 211.

At the timing $t_{11}$, the control circuit 211 outputs a store signal 221 (see FIG. 3) to all of the counter registers 212-1, 212-2, 212-3, etc. At the timing $t_{11}$, each of the counter registers 212-1, 212-2, 212-3, etc. buffers (transfers, copies) the counter value of the counter 214 to the buffer 215.

Referring to FIG. 4, at the timing $t_{11}$, the counter value, "19", of the counter 214 in the counter register 212-1 is buffered to the buffer 215 in the counter register 212-1. At the timing $t_{11}$, the counter value, "29", of the counter 214 in the counter register 212-2 is buffered to the buffer 215 in the counter register 212-2.

The one-clock period from the timing $t_{11}$ to the timing $t_{12}$ serves as the first data readout timing RD.

At the first data readout timing RD, the control circuit 211 outputs an address signal 222 (see FIG. 3) for appointing the counter register 212-1. The buffer 215 in the counter register 212-1 outputs the buffer value, "19", to the readout circuit 213. The readout circuit 213 outputs the buffer value, "19", to the control circuit 111.

In the eight-clock period from the timing $t_{12}$ to the timing $t_{13}$, the control circuit 211 outputs, to the master circuit 101, the output data signal data_out obtained by converting the buffer value of "19", which is parallel data, to serial data.

The one-clock period from the timing $t_{13}$ to the timing $t_{14}$ serves as the second data readout timing RD.

At the second data readout timing RD, the control circuit 211 outputs the address signal 222 (see FIG. 3) for appointing the counter register 212-2. The buffer 215 in the counter register 212-2 outputs the buffer value, "29", to the readout circuit 213. The readout circuit 213 outputs the buffer value, "29", to the control circuit 111.

In the eight-clock period from the timing $t_{14}$ to the timing $t_{15}$, the control circuit 211 outputs, to the master circuit 101, the output data signal data_out obtained by converting the buffer value of "29", which is parallel data, to 8-bit serial data.

The control circuit 211 and the readout circuit 213 repeatedly perform operations similar to those from the timing $t_{11}$ to the timing $t_{13}$ (from the timing $t_{13}$ to the timing $t_{15}$) multiple times whose number is equal to the number of counter registers.

The second comparison example satisfies a demand that the counter values of the counters 214 of all of the counter registers 212-1, 212-2, 212-3, etc. at the same timing (the timing $t_{11}$) are to be read out. However, the second comparison example involves the buffers 215 included in the counter registers 212-1, 212-2, 212-3, etc.

When a buffer 215 is 8-bit width, the buffer 215 is formed of, for example, eight D flip-flops. A single D flip-flop is formed, for example, of eight NOT-AND (NAND) gate circuits and two NOT gate circuits. That is, a single buffer 215 is formed of a large number of transistors.

An increase in the number of counter registers 212-1, 212-2, 212-3, etc. (for example, 16 counter registers, 32 counter registers, 64 counter registers, etc.) causes the number of buffers 215 to increase and causes the number of transistors to increase. That is, the circuit size is made larger, and the footprint is made larger. Accordingly, a larger circuit size causes the cost to rise due to an increase in the manufacture cost and the time for layout.

Embodiment

Figure 5:
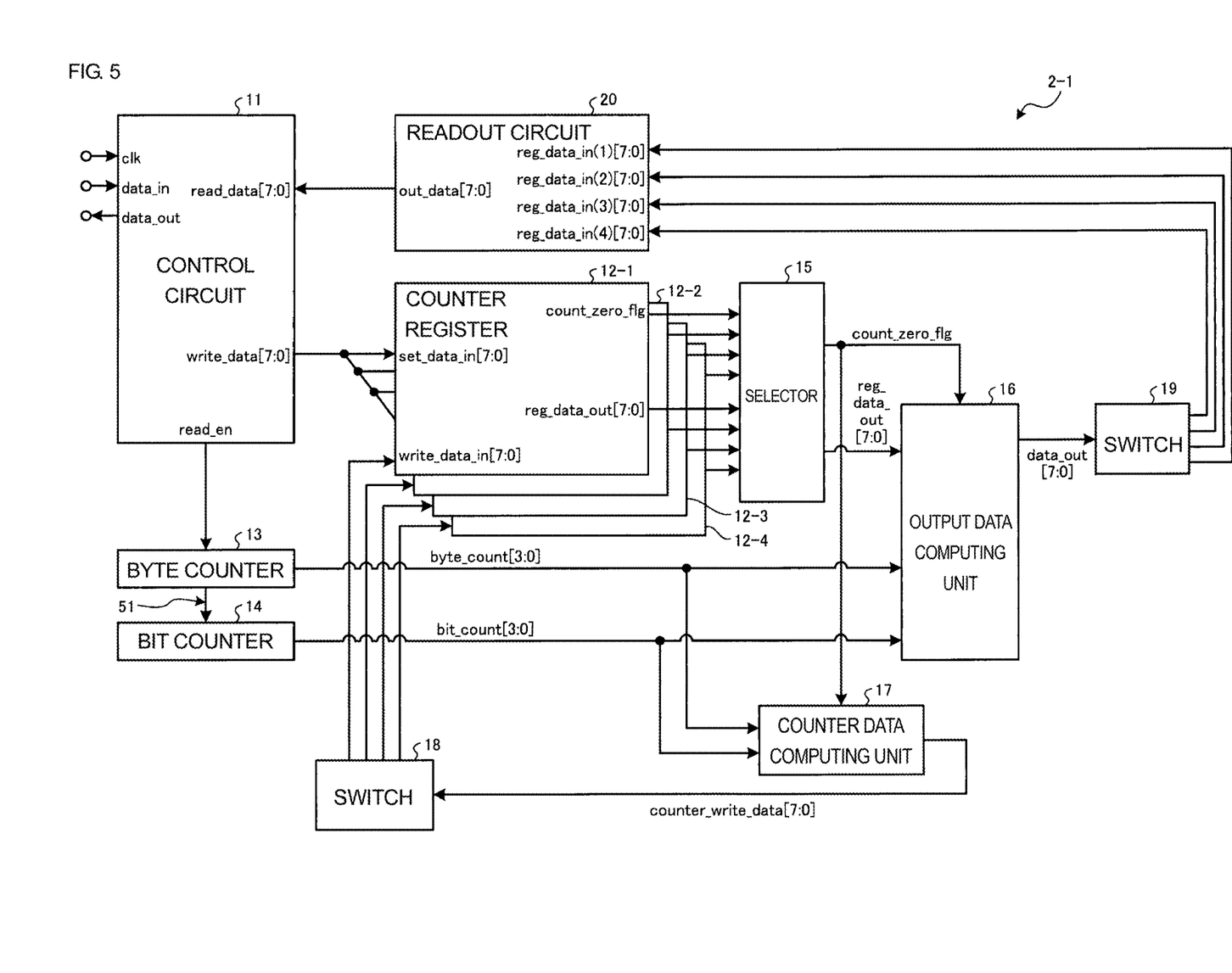
FIG. 5 is a diagram illustrating the configuration of a slave circuit according to an embodiment.

FIG. 5 is a diagram illustrating the configuration of a slave circuit according to an embodiment. The system configuration using a slave circuit 2-1 is similar to that according to the first comparison example in FIG. 1, and its illustration and description will not be made.

The slave circuit 2-1 corresponds to a "counter readout circuit" provided by the present disclosure.

The slave circuit 2-1 includes a control circuit 11, counter registers 12-1 to 12-4, a byte counter 13, a bit counter 14, a selector 15, an output data computing unit 16, a counter data computing unit 17, a switch 18, a switch 19, and a readout circuit 20.

In the embodiment, the number of counter registers is four. The present disclosure is not limited to this. For example, the number of counter registers may be, for example, 8, 16, or 32.

In FIG. 5, to simplify and easily read the drawing, a clock signal clk and an address signal, which are output from the control circuit 11 to the units, are not illustrated.

The control circuit 11 receives the clock signal clk and the input data signal data_in from the master circuit 101 (see FIG. 1).

The control circuit 11 outputs write data write_data[7:0], which indicates an initial value, to each of the counter registers 12-1 to 12-4 on the basis of a command (the input data signal data_in) for setting initial values to the counter registers 12-1 to 12-4. Each of the counter registers 12-1 to 12-4 receives the write data write_data[7:0] as the set data set_data_in[7:0], and sets the value to the initial value of the counter value reg_data_out[7:0].

The write data write_data[7:0] and the set data set_data_in[7:0] are the same signal, and only difference is that the signal names are different between the transmitting side and the receiving side.

The control circuit 11 outputs the clock signal clk to the counter registers 12-1 to 12-4, the byte counter 13, and the bit counter 14. The counter registers 12-1 to 12-4 decrement their counter values per clock cycle.

The control circuit 11 outputs the read enable signal read_en to the byte counter 13 at a timing (hereinafter, referred to as a "counter-value acquisition request timing") at which reception of a data readout request command (the input data signal data_in) from the master circuit 101 is completed.

The counter-value acquisition request timing corresponds to a "first timing" in the present disclosure.

Upon reception of the read enable signal read_en, the byte counter 13 increments the byte counter value byte_count[3:0] once every nine clock cycles (8 (the bit width of the counter value)+1 (a data readout timing RD)=9). When the byte counter value byte_count[3:0] is incremented, that is, once every nine clock cycles, the byte counter 13 outputs a bit-counter reset signal 51 to the bit counter 14.

The number "9" corresponds to a "predetermined number" in the present disclosure.

When the bit counter 14 receives the read enable signal read_en, the bit counter 14 increments the bit counter value bit_count[3:0] per clock cycle. When the bit counter 14 receives the bit-counter reset signal 51 from the byte counter 13, the bit counter 14 resets the bit counter value bit_count[3:0] to "1". That is, the bit counter 14 counts in the following sequence: "0" (the initial value), "1", "2", . . . , "8", "9", "1", "2", . . . .

That is, the byte counter 13 and the bit counter 14 form a nonary counter in which the byte counter 13 serves as the high-order digit and the bit counter 14 serves as the low order digit.

The byte counter 13 and the bit counter 14 correspond to an "L-ary counter" provided by the present disclosure.

Each of the counter registers 12-1 to 12-4 outputs its counter value reg_data_out[7:0] to the selector 15. Each of the counter registers 12-1 to 12-4 outputs its count zero flag count_zero_flg to the selector 15. When the counter value reg_data_out[7:0] reaches zero, the count zero flag count_zero_flg is set to "1". Otherwise, the count zero flag count_zero_flg is set to "0". Each of the counter registers 12-1 to 12-4 stops counting when its count zero flag count_zero_flg is set to "1".

The selector 15 selects one of the counter registers 12-1 to 12-4 on the basis of the address signal received from the control circuit 11. The selector 15 outputs, to the output data computing unit 16, the counter value reg_data_out[7:0] received from the selected counter register. The selector 15 outputs, to the output data computing unit 16 and the counter data computing unit 17, the count zero flag count_zero_flg received from the selected counter register.

When the count zero flag count_zero_flg received from the selector 15 is set to "0", the output data computing unit 16 outputs, to the switch 19, the output data data_out[7:0] obtained through calculation using Expression (1) described below.

$$\text{data\_out}[7:0] = \text{reg\_data\_out}[7:0] + \text{byte\_count}[3:0] \times 9 + \text{bit\_count}[3:0] \quad (1)$$

In Expression (1), the part, "byte_count[3:0]×9+bit_count[3:0]", corresponds to the total clock count from the counter-value acquisition request timing to the current time.

When the count zero flag count_zero_flg received from the selector 15 is set to "1", the output data computing unit 16 outputs, to the switch 19, the counter value reg_data_out[7:0], as it is, as the output data data_out[7:0].

When the count zero flag count_zero_flg received from the selector 15 is set to "1", the counter data computing unit 17 outputs, to the switch 18, the counter write data counter_write_data[7:0] obtained through calculation using Expression (2) described below.

$$\text{counter\_write\_data}[7:0] = \text{byte\_count}[3:0] \times 9 + \text{bit\_count}[3:0] \quad (2)$$

That is, the counter write data counter_write_data[7:0] corresponds to the total clock count from the counter-value acquisition request timing to the timing at which the count zero flag count_zero_flg is switched to "1".

The switch 18 selects one of the counter registers 12-1 to 12-4 on the basis of the address signal received from the control circuit 11. The switch 18 outputs the counter write data counter_write_data[7:0] to the counter register selected from the counter registers 12-1 to 12-4. The counter register selected from the counter registers 12-1 to 12-4 receives the counter write data counter_write_data[7:0] as the write data write data_in[7:0], and sets the received data to the counter value reg_data_out[7:0]. When the count zero flag count_zero_flg is set to "1", the counter register selected from the counter registers 12-1 to 12-4 stops the counting down operation, receives the counter write data counter_write_data[7:0] as the write data write_data_in[7:0], and holds the received data.

The counter write data counter_write_data[7:0] and the write data write_data_in[7:0] are the same signal, and only difference is that the signal names are different between the transmitting side and the receiving side.

The switch 19 outputs, to the readout circuit 20, the output data data_out[7:0] as the first output data reg_data_in(1)[7:0] of the counter register 12-1, the second output data reg_data_in(2)[7:0] of the counter register 12-2, the third output data reg_data_in(3)[7:0] of the counter register 12-3, or the fourth output data reg_data_in(4)[7:0] of the counter register 12-4 on the basis of the address signal received from the control circuit 11.

The readout circuit 20 outputs, to the control circuit 11, the first output data reg_data_in(1)[7:0], the second output data reg_data_in(2)[7:0], the third output data reg_data_in(3)[7:0], or the fourth output data reg_data_in(4)[7:0] as the output data out_data[7:0].

The control circuit 11 receives the output data out_data[7:0] as the read data read_data[7:0].

The output data out_data[7:0] and the read data read_data[7:0] are the same signal, and only difference is that the signal names are different between the transmitting side and the receiving side.

The control circuit 11 outputs, to the master circuit 101, the output data data_out obtained by converting the read data read_data[7:0] to 8-bit serial data.

Figure 6:
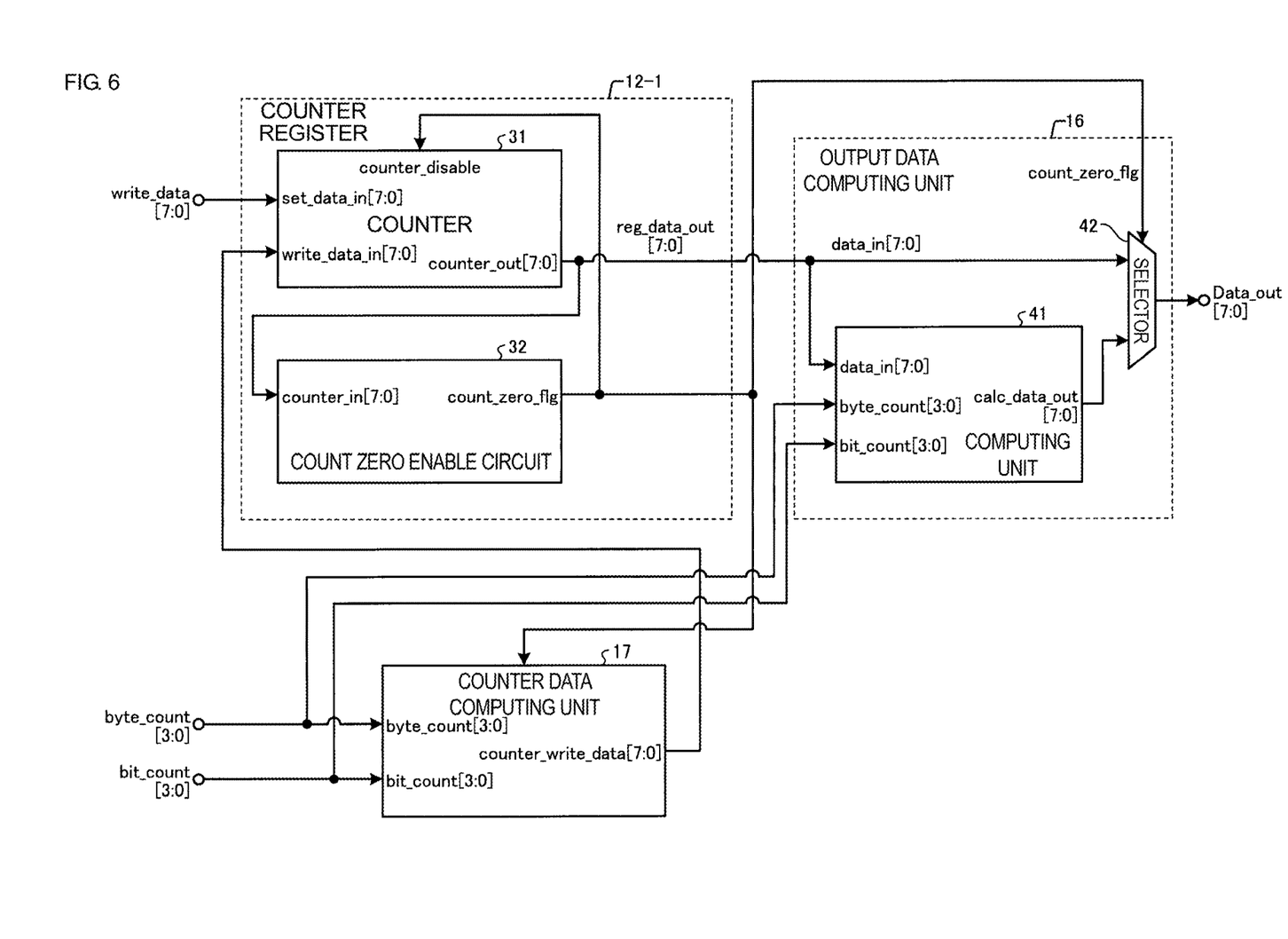
FIG. 6 is a diagram illustrating the internal configuration of part of a slave circuit according to an embodiment.

FIG. 6 is a diagram illustrating the internal configuration of a part of a slave circuit according to the embodiment. Specifically, FIG. 6 is a diagram illustrating the internal configuration of the counter register 12-1, the output data computing unit 16, and the counter data computing unit 17.

In FIG. 6, under the assumption that the counter register 12-1 has been selected through the address signal, the selector 15 and the switch 18 are not illustrated.

The counter register 12-1 includes a counter 31 and a count zero enable circuit 32.

The output data computing unit 16 includes a computing unit 41 and a selector 42.

The counter 31 receives the write data write_data[7:0], which is output from the control circuit 11, as the set data set_data_in[7:0], and sets the received data as the initial value of the counter value counter_out[7:0].

The counter 31 decrements the counter value counter_out[7:0] per clock cycle, and outputs the resulting data as the counter value reg_data_out[7:0] to the count zero enable circuit 32, the computing unit 41, and the selector 42.

The counter value counter_out[7:0] and the counter value reg_data_out[7:0] are the same signal, and only difference is that the signal names are different between the transmitting side and the receiving side.

The count zero enable circuit 32 receives the counter value counter_out[7:0], which is output from the counter 31, as the counter value counter_in[7:0].

The counter value counter_out[7:0] and the counter value counter_in[7:0] are the same signal, and only difference is that the signal names are different.

When the counter value counter_in[7:0] reaches a specific value, the count zero enable circuit 32 outputs a flag, which is set to "1". For example, when the counter value counter_in[7:0] is "0", the count zero enable circuit 32 outputs the count zero flag count_zero_flg, which is set to "1", to the counter 31, the counter data computing unit 17, and the selector 42. When the counter value counter_in[7:0] is a value which is different from the specific value, the count zero enable circuit 32 outputs a flag, which is set to "0". For example, when the counter value counter_in[7:0] is not "0", the count zero enable circuit 32 outputs the count zero flag count_zero_flg, which is set to "0", to the counter 31, the counter data computing unit 17, and the selector 42. Herein, although the specific value is exemplified as "0", the specific value is not limited to "0" as long as the specific value is an integer.

The count zero enable circuit 32 is formed, for example, of a NOR gate circuit which performs an 8-bit NOR operation on the counter value counter_in[7:0]. However, the present disclosure is not limited to this.

The counter 31 receives the count zero flag count_zero_flg, which is output from the count zero enable circuit 32, as the counter disable signal counter_disable.

The count zero flag count_zero_flg and the counter disable signal counter_disable are the same signal, and only difference is that the signal names are different.

When the count zero flag count_zero_flg is set to "1", the counter data computing unit 17 outputs, to the counter 31, the counter write data counter_write_data[7:0] obtained through calculation using Expression (2) described above.

The counter data computing unit 17 is formed, for example, of a multiply-accumulate operation circuit. However, the present disclosure is not limited to this.

When the counter disable signal counter_disable is switched to "1", the counter 31 stops counting down.

When the counter disable signal counter_disable is switched to "1", the counter 31 receives the counter write data counter_write_data[7:0] (corresponding to the total clock count from the counter-value acquisition request timing to the current time) as the write data write_data_in[7:0].

The counter write data counter_write_data[7:0] and the write data write_data_in[7:0] are the same signal, and only difference is that the signal names are different.

The counter 31 sets the write data write_data_in[7:0] to the counter value counter_out[7:0]. That is, the counter value counter_out[7:0] indicates the total clock count from the counter-value acquisition request timing to the timing at which the counter disable signal counter_disable is switched to "1".

The computing unit 41 receives the counter value reg_data_out[7:0] as the input data data_in[7:0].

The counter value reg_data_out[7:0] and the input data data_in[7:0] are the same signal, and only difference is that the signal names are different.

The computing unit 41 outputs, to the selector 42, the calculated data calc_data_out[7:0] obtained through calculation using Expression (1) described above.

The computing unit 41 is formed, for example, of a multiply-accumulate operation circuit. However, the present disclosure is not limited to this.

When the count zero flag count_zero_flg is set to "0", the selector 42 outputs, to the readout circuit 20, the calculated data calc_data_out[7:0], which is calculated by the computing unit 41, as the output data data_out[7:0].

The calculated data calc_data_out[7:0] and the output data data_out[7:0] are the same signal, and only difference is that the signal names are different.

When the count zero flag count_zero_flg is set to "1", the selector 42 outputs, to the readout circuit 20, the input data data_in[7:0], which is output from the counter 31, as the output data data_out[7:0].

The input data data_in[7:0] and the output data data_out [7:0] are the same signal, and only difference is that the signal names are different.

That is, when the count zero flag count_zero_flg is set to "0", the output data data_out[7:0] is a value obtained by adding the counter value reg_data_out[7:0] to the total clock count from the counter-value acquisition request timing to the current time.

When the count zero flag count_zero_flg is set to "1", the counter value reg_data_out[7:0] is used as the output data data_out[7:0]. At that time, the counter value reg_data_out [7:0] is the total clock count from the counter-value acquisition request timing to the timing at which the count zero flag count_zero_flg is switched to "1".

Operations of the slave circuit 2-1 will be described. First, the case in which the counter values do not reach "0" will be described. Then, the case in which a counter value reaches "0" will be described.

Figure 7:
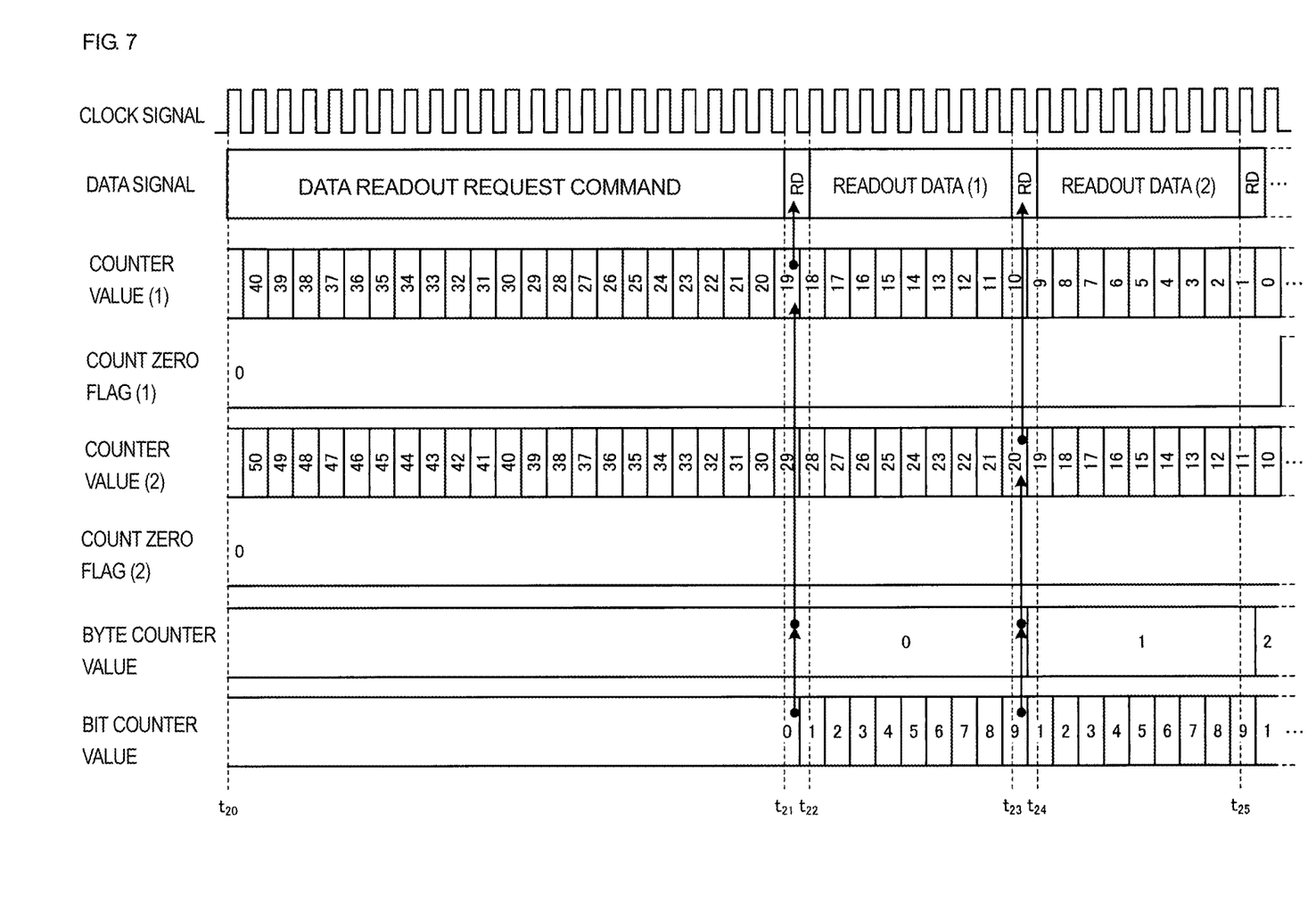
FIG. 7 is a timing chart of operations according to an embodiment.

FIG. 7 is a timing chart of operations according to the embodiment. Specifically, FIG. 7 is a timing chart of operations performed when the master circuit 101 requests readout of the counter values of the counter registers 12-1 to 12-4. FIG. 7 illustrates the counter values of the counter registers 12-1 and 12-2.

Over the entire range in FIG. 7, the clock signal clk is input to the slave circuit 2-1. Accordingly, over the entire range in FIG. 7, the counter registers 12-1 to 12-4 decrement their counter values per clock cycle. The counter values are changed at every falling edge of the clock signal clk.

The counter 31 in the counter register 12-1 starts counting down from a counter value of "40". The counter 31 in the counter register 12-2 starts counting down from a counter value of "50".

From the timing $t_{20}$ to the timing $t_{21}$, the master circuit 101 outputs a data readout request command (the input data signal data_in) to the control circuit 11.

At any timing from the timing $t_{20}$ to the timing $t_{21}$, the control circuit 11 outputs an address signal for selecting the counter register 12-1, to the selector 15, the switch 18, and the switch 19.

The one-clock period from the timing $t_{21}$ to the timing $t_{22}$ serves as the first data readout timing RD.

At the timing $t_{21}$, the counter value reg_data_out[7:0] of the counter 31 in the counter register 12-1 is "19". Accordingly, the count zero flag count_zero_flg in the counter register 12-1 is set to "0".

The computing unit 41 in the output data computing unit 16 performs calculation using Expression (1) described above. At the timing $t_{21}$, the byte counter value byte_count [3:0] is "0", and the bit counter value bit_count[3:0] is "0". Accordingly, the calculated data calc_data_out[7:0] calculated by the computing unit 41 by using Expression (1) described above is as follows.

$$\begin{aligned} \text{calc\_data\_out}[7:0] &= \text{reg\_data\_out}[7:0] + \text{byte\_count}[3:0] \times \\ & \quad 9 + \text{bit\_count}[3:0] \\ &= 19 + 0 + 0 \\ &= 19 \end{aligned}$$

Since the count zero flag count_zero_flg in the counter register 12-1 is set to "0", the selector 42 in the output data computing unit 16 outputs, to the readout circuit 20, the calculation result, "19", (calc_data_out[7:0]) as the output data data_out[7:0].

At the first data readout timing RD, the readout circuit 20 outputs, to the control circuit 11, "19" which is output by the counter register 12-1.

The timing $t_{21}$ corresponds to the "first timing" and a "second timing" in the present disclosure.

In the eight-clock period from the timing $t_{22}$ to the timing $t_{23}$, the control circuit 11 outputs, to the master circuit 101, the output data signal data_out obtained by converting the counter value of "19", which is parallel data, to 8-bit serial data.

At the timing $t_{22}$, the control circuit 11 outputs an address signal for selecting the counter register 12-2, to the selector 15, the switch 18, and the switch 19.

The one-clock period from the timing $t_{23}$ to the timing $t_{24}$ serves as the second data readout timing RD.

At the timing $t_{23}$, the counter value reg_data_out[7:0] of the counter 31 in the counter register 12-2 is "20". Accordingly, the count zero flag count_zero_flg in the counter register 12-2 is set to "0".

The computing unit 41 in the output data computing unit 16 performs calculation using Expression (1) described above. At the timing $t_{23}$, the byte counter value byte_count [3:0] is "0", and the bit counter value bit_count[3:0] is "9". Thus, the calculated data calc_data_out[7:0] calculated by the computing unit 41 by using Expression (1) described above is as follows.

$$\begin{aligned} \text{calc\_data\_out}[7:0] &= \text{reg\_data\_out}[7:0] + \text{byte\_count}[3:0] \times \\ & \quad 9 + \text{bit\_count}[3:0] \\ &= 20 + 0 + 9 \\ &= 29 \end{aligned}$$

The value, "29", of the calculated data calc_data_out[7:0] is equal to the counter value reg_data_out[7:0] of the counter 31 in the counter register 12-2 at the counter-value acquisition request timing (the timing $t_{21}$).

Since the count zero flag count_zero_flg in the counter register 12-2 is set to "0", the selector 42 in the output data computing unit 16 outputs, to the readout circuit 20, the calculation result, "29", (calc_data_out[7:0]) as the output data data_out[7:0].

The value, "29", of the output data data_out[7:0] is equal to the counter value reg_data_out[7:0] of the counter 31 in the counter register 12-2 at the counter-value acquisition request timing (the timing $t_{21}$).

At the second data readout timing RD, the readout circuit 20 outputs, to the control circuit 11, "29" which is output by the counter register 12-2.

The timing $t_{21}$ corresponds to the "first timing" in the present disclosure. The timing $t_{23}$ corresponds to the "second timing" in the present disclosure.

In the eight-clock period from the timing $t_{24}$ to the timing $t_{25}$, the control circuit 11 outputs, to the master circuit 101, the output data signal data_out obtained by converting the counter value of "29", which is parallel data, to 8-bit serial data.

The control circuit 11 and the readout circuit 20 repeatedly perform operations similar to those from the timing $t_{21}$ to the timing $t_{23}$ (from the timing $t_{23}$ to the timing $t_{25}$) multiple times whose number is equal to the number of counters.

Figure 8:
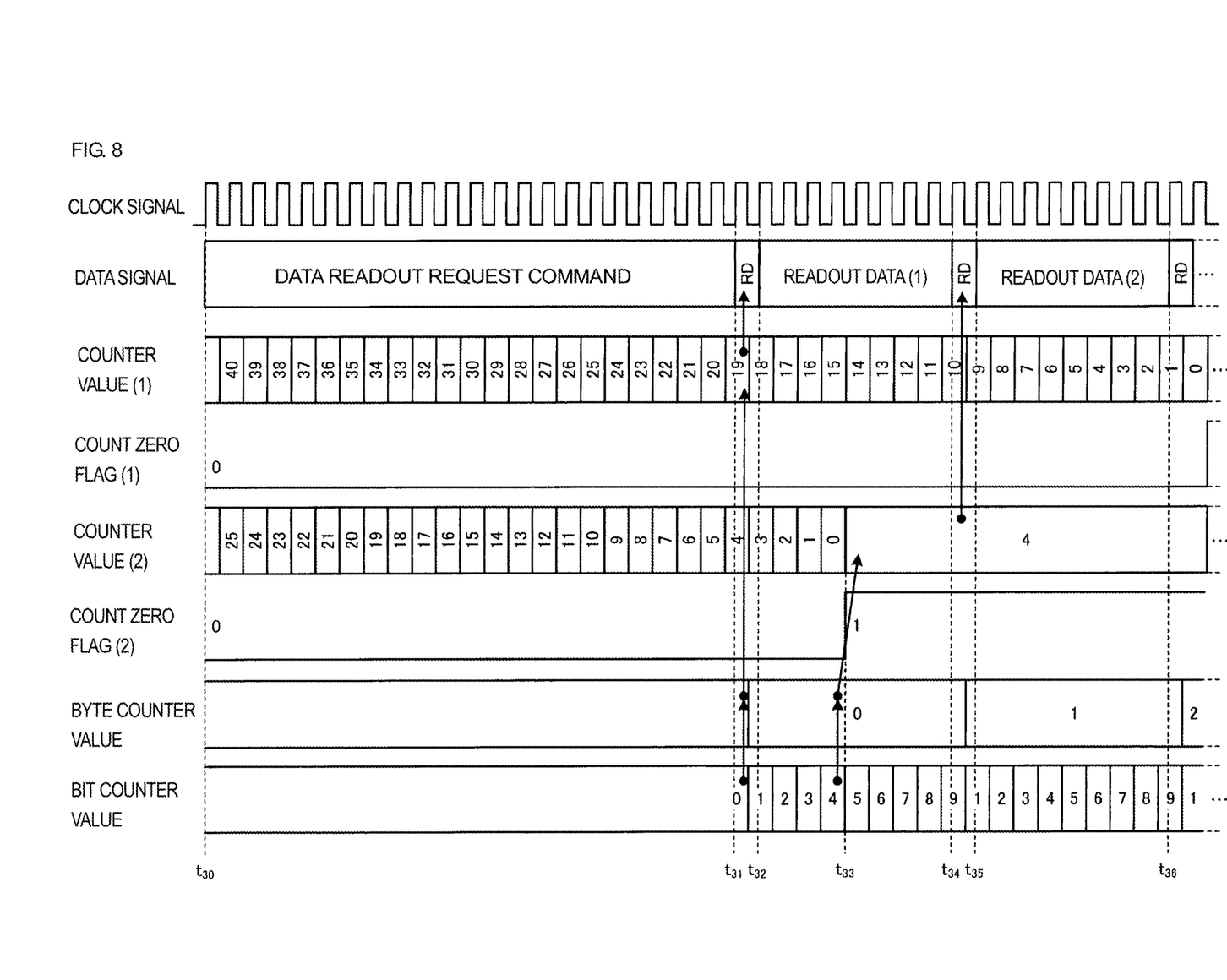
FIG. 8 is a timing chart of operations according to an embodiment.

Operations of the slave circuit 2-1 which are performed when a counter value reaches "0" will be described.

FIG. 8 is a timing chart of operations according to the embodiment. Specifically, FIG. 8 is a timing chart of operations performed when the master circuit 101 requests readout of the counter values of the counter registers 12-1 to 12-4. FIG. 8 illustrates the counter values of the counter registers 12-1 and 12-2.

Over the entire range in FIG. 8, the clock signal clk is input to the slave circuit 2-1. Accordingly, over the entire range in FIG. 8, the counter registers 12-1 to 12-4 decrement their counter values per clock cycle. The counter values are changed at every falling edge of the clock signal clk.

The counter 31 in the counter register 12-1 starts counting down from a counter value of "40". The counter 31 in the counter register 12-2 starts counting down from a counter value of "25".

From the timing $t_{30}$ to the timing $t_{31}$, the master circuit 101 outputs a data readout request command (the input data signal data_in) to the control circuit 11.

At any timing from the timing $t_{30}$ to the timing $t_{31}$, the control circuit 11 outputs an address signal for selecting the counter register 12-1, to the selector 15, the switch 18, and the switch 19.

The one-clock period from the timing $t_{31}$ to the timing $t_{32}$ serves as the first data readout timing RD.

At the timing $t_{31}$, the counter value reg_data_out[7:0] of the counter 31 in the counter register 12-1 is "19". Accordingly, the count zero flag count_zero_flg in the counter register 12-1 is set to "0".

The computing unit 41 in the output data computing unit 16 performs calculation using Expression (1) described above. At the timing $t_{31}$, the byte counter value byte_count[3:0] is "0". The bit counter value bit_count[3:0] is "0". Accordingly, the calculated data calc_data_out[7:0] calculated by the computing unit 41 by using Expression (1) described above is as follows.

$$\begin{aligned} \text{calc\_data\_out}[7:0] &= \text{reg\_data\_out}[7:0] + \text{byte\_count}[3:0] \times \\ & \quad 9 + \text{bit\_count}[3:0] \\ &= 19 + 0 + 0 \\ &= 19 \end{aligned}$$

Since the count zero flag count_zero_flg in the counter register 12-1 is set to "0", the selector 42 in the output data computing unit 16 outputs, to the readout circuit 20, the calculation result, "19", (calc_data_out[7:0]) as the output data data_out[7:0].

At the first data readout timing RD, the readout circuit 20 outputs, to the control circuit 11, "19" which is output by the counter register 12-1.

The timing $t_{31}$ corresponds to the "first timing" and the "second timing" in the present disclosure.

In the eight-clock period from the timing $t_{32}$ to the timing $t_{34}$, the control circuit 11 outputs, to the master circuit 101, the output data signal data_out obtained by converting the counter value of "19", which is parallel data, to 8-bit serial data.

At the timing $t_{32}$, the control circuit 11 outputs an address signal for selecting the counter register 12-2, to the selector 15, the switch 18, and the switch 19.

At the timing $t_{33}$, the counter value reg_data_out[7:0] of the counter 31 in the counter register 12-2 reaches "0". Accordingly, the count zero flag count_zero_flg in the counter register 12-2 is set to "1".

At that time, the count zero enable circuit 32 may interrupt the selector 15, the counter data computing unit 17, and the switch 18.

At the timing $t_{33}$, the counter write data counter_write_data[7:0] calculated by the counter data computing unit 17 by using Expression (2) described above is as follows.

$$\begin{aligned} \text{counter\_write\_data}[7:0] &= \text{byte\_count}[3:0] \times 9 + \text{bit\_count}[3:0] \\ &= 0 + 4 \\ &= 4 \end{aligned}$$

Since the count zero flag count_zero_flg (the counter disable signal counter_disable) is set to "1", the counter 31 in the counter register 12-2 stops counting down, and sets the write data write_data_in[7:0] (the counter write data counter_write_data[7:0]), "4", to the counter value counter_out[7:0].

At the timing $t_{33}$, the counter 31 in the counter register 12-2 stops counting down. Accordingly, after the timing $t_{33}$, the counter value counter_out[7:0] of the counter 31 in the counter register 12-2 remains at "4".

The value, "4", of the counter value counter_out[7:0] of the counter 31 in the counter register 12-2 is equal to the counter value reg_data_out[7:0] of the counter 31 in the counter register 12-2 at the counter-value acquisition request timing (the timing $t_{31}$).

The one-clock period from the timing $t_{34}$ to the timing $t_{35}$ serves as the second data readout timing RD.

At the timing $t_{34}$, the counter value reg_data_out[7:0] (the counter value counter_out[7:0]) of the counter 31 in the counter register 12-2 is "4".

Since the count zero flag count_zero_flg in the counter register 12-2 is set to "1", the selector 42 in the output data computing unit 16 outputs, to the readout circuit 20, the counter value reg_data_out[7:0], "4", as the output data data_out[7:0].

The value, "4", of the output data data_out[7:0] is equal to the counter value reg_data_out[7:0] of the counter 31 in the counter register 12-2 at the counter-value acquisition request timing (the timing $t_{31}$).

At the second data readout timing RD, the readout circuit 20 outputs, to the control circuit 11, "4" which is output by the counter register 12-2.

The timing $t_{31}$ corresponds to the "first timing" in the present disclosure. The timing $t_{34}$ corresponds to the "second timing" in the present disclosure.

In the eight-clock period from the timing $t_{35}$ to the timing $t_{36}$, the control circuit 11 outputs, to the master circuit 101, the output data signal data_out obtained by converting the counter value of "4", which is parallel data, to 8-bit serial data.

The control circuit 11 and the readout circuit 20 repeatedly perform operations similar to those from the timing $t_{31}$ to the timing $t_{34}$ (from the timing $t_{34}$ to the timing $t_{35}$) multiple times whose number is equal to the number of counters.

As described above, the slave circuit 2-1 according to the embodiment may satisfy the demand that the counter values of the counters 31 of all of the counter registers 12-1 to 12-4 at the counter-value acquisition request timing (the timing $t_{21}$ in FIG. 7, the timing $t_{31}$ in FIG. 8) are to be read out.

When the slave circuit 2-1 according to the embodiment is compared with the slave circuit 202-1 according to the second comparison example, each of the counter registers 12-1 to 12-4 does not need to include a buffer. As described above, a buffer is formed of a large number of transistors. Thus, compared with the slave circuit 202-1 according to the second comparison example, the slave circuit 2-1 according to the embodiment may cause the number of transistors to be reduced. That is, the slave circuit 2-1 may achieve suppression of the circuit size and suppression of the footprint. In addition, the slave circuit 2-1 may achieve suppression of the cost.

In the embodiment, the case in which the number of counter registers is four is described. When the number of counter registers is thus relatively small, the merit of a reduction in the number of buffers is suppressed by the demerit of addition of the byte counter 13, the bit counter 14, the output data computing unit 16, and the counter data computing unit 17. However, as the number of counter registers is larger (for example, 8, 16, 32, etc.), the merit of a reduction in the number of buffers is made much larger than the demerit of addition of the byte counter 13, the bit counter 14, the output data computing unit 16, and the counter data computing unit 17.

In the embodiment, the byte counter 13 and the bit counter 14 are included. The total clock count from the counter-value acquisition request timing to the current time is calculated in a multiply-accumulate operation, "byte_count[3:0]×9+bit_count[3:0]". The present disclosure is not limited to this. For example, the total clock count from the counter-value acquisition request timing to the current time may be obtained simply by using a single counter.

The embodiment described above is made in order that the present disclosure is easily understood. The embodiment does not limit the interpretation of the present disclosure. The present disclosure may be changed/improved without necessarily departing from the gist thereof. The present disclosure encompasses its equivalents.

While embodiments of the disclosure have been described above, it is to be understood that variations and modifications will be apparent to those skilled in the art without necessarily departing from the scope and spirit of the disclosure. The scope of the disclosure, therefore, is to be determined solely by the following claims.

What is claimed is:

1. A counter readout circuit comprising:
 a plurality of counter registers that each comprise a counter configured to count cycles of a clock signal; and
 an output data computing circuit configured to calculate a calculated data value by adding a counter value of a selected one of the plurality of counter registers to a total clock count, and configured to output the calculated data, wherein:
 the total clock count is a number of clock cycles between a first timing and a second timing,
 the first timing is a time at which the counter readout circuit receives a first data readout request common to all of the counter registers, and
 the second timing is a time at which the counter readout circuit receives a second data readout request specific to the selected one of the counter registers.

2. The counter readout circuit according to claim 1, further comprising:
 a counter data computing circuit configured to calculate the total clock count,
 wherein each of the plurality of counter registers further comprises a count zero enable circuit configured to, when the counter value reaches zero, set a flag indicating that the counter value of the respective counter register has reached the specified value, and
 wherein, when the flag is set, the counter is configured to stop counting and set the counter value to the total clock count.

3. The counter readout circuit according to claim 2, wherein the output data computing circuit further comprises a selector that is configured to:
 when the flag of the counter of the selected one of the counter registers is not set, output the calculated data value calculated by the output data computing circuit, and
 when the flag of the selected counter is set, output the counter value set in the counter.

4. The counter readout circuit according to claim 3, further comprising:
 an L-ary counter, wherein L is a predetermined number,
 wherein the output data computing circuit and the counter data computing circuit are each configured to calculate the total clock count by adding a value of a low order digit of the L-ary counter to a product of a value of a high-order digit of the L-ary counter and the predetermined number.

5. The counter readout circuit according to claim 2, further comprising:
 an L-ary counter, wherein L is a predetermined number,
 wherein the output data computing circuit and the counter data computing circuit are each configured to calculate the total clock count by adding a value of a low order digit of the L-ary counter to a product of a value of a high-order digit of the L-ary counter and the predetermined number.

* * * * *

UNITED STATES PATENT AND TRADEMARK OFFICE
CERTIFICATE OF CORRECTION

PATENT NO. : 11,200,480 B2
APPLICATION NO. : 16/690772
DATED : December 14, 2021
INVENTOR(S) : Matsuyama et al.

It is certified that error appears in the above-identified patent and that said Letters Patent is hereby corrected as shown below:

In the Specification

Column 12, Line 65, "to the timing $t_{35}$)" should be -- to the timing $t_{36}$) --.

Signed and Sealed this
Thirteenth Day of September, 2022

Katherine Kelly Vidal
*Director of the United States Patent and Trademark Office*